United States Patent

Yang

[11] Patent Number: 6,124,743
[45] Date of Patent: Sep. 26, 2000

[54] REFERENCE VOLTAGE GENERATION CIRCUIT FOR COMPARATOR

[75] Inventor: Yil-Suk Yang, Kyungsangbuk-Do, Rep. of Korea

[73] Assignee: LG Semicon Co., Ltd., Cheongju, Rep. of Korea

[21] Appl. No.: 09/235,748

[22] Filed: Jan. 25, 1999

Related U.S. Application Data

[63] Continuation-in-part of application No. 08/911,368, Aug. 7, 1997.

[30] Foreign Application Priority Data

Aug. 24, 1996 [KR] Rep. of Korea .................. 96-35282

[51] Int. Cl.[7] ............................................. H03K 5/13
[52] U.S. Cl. ......................... 327/198; 327/58; 327/143; 327/538
[58] Field of Search ................ 327/540, 77, 78, 327/89, 88, 87, 91, 94, 95, 96, 124, 164, 130, 131; 323/314

[56] References Cited

U.S. PATENT DOCUMENTS

| | | |
|---|---|---|
| 4,363,976 | 12/1982 | Minor ................................. 327/58 |
| 4,517,520 | 5/1985 | Ogawa ................................ 329/145 |
| 4,588,905 | 5/1986 | Kojima .................................. 327/91 |
| 5,025,434 | 6/1991 | Tateishi et al. .................... 369/44.36 |
| 5,196,741 | 3/1993 | Rustici .................................. 327/91 |
| 5,381,053 | 1/1995 | Yasuda ................................. 327/77 |
| 5,498,986 | 3/1996 | Manlove .............................. 327/77 |

*Primary Examiner*—Timothy P. Callahan
*Assistant Examiner*—Hiep Nguyen
*Attorney, Agent, or Firm*—Fleshner & Kim, LLP

[57] ABSTRACT

A reference voltage generation circuit which is capable of generating a reference voltage having multiple steps by using a periodic response characteristic of a chaotic circuit. The circuit includes a first sample/hold unit for sampling and holding a periodic output voltage V3 in accordance with a first clock signal CLK1 from an externally connected clock signal generation unit, a second sample/hold unit for sampling and holding an output voltage V3' from the first sample/hold unit in accordance with a second clock signal CLK2 from the externally connected clock signal generation unit, a non-linear unit for receiving voltage V4 from the second sample/hold unit and outputting a non-linear voltage V2 signal having a sawtooth-shaped transfer characteristic, and an addition unit for adding the non-linear voltage signal V2 from the non-linear unit and an externally applied voltage signal V1 and outputting the periodic output voltage V3.

18 Claims, 4 Drawing Sheets

CLK1

CLK2

REFERENCE VOLTAGE GENERATION CIRCUIT FOR COMPARATOR

This is a continuation-in-part application of U.S. Ser. No. 08/911,368 filed Aug. 7, 1997, the entire disclosure of which is incorporated herein by reference.

BACKGROUND OF THE INVENTION

1. Field of the Invention

The present invention relates to a reference voltage generation circuit capable of generating a reference voltage having multiple steps by using a periodic response characteristic of a chaotic circuit.

2. Background of the Related Art

The comparator is a circuit for comparing a reference voltage and an input voltage and operates as a voltage level detector. Conventionally, a related art comparator includes a 74-series operational amplifier and a plurality of variable resistors.

FIG. 1 illustrates a related art comparator circuit. As shown therein, the comparator includes an operational amplifier OP and three variable resistors R1 through R3. The operational amplifier OP is connected between a power voltage $V_{CC}$ and a ground voltage $V_{EE}$, and receives an input voltage $V_{IN}$ at an inverting input terminal (−) thereof. The variable resistors R1, R2 and R3 are connected in series between the power supply voltage $V_{CC}$ and the ground voltage $V_{EE}$. A terminal which commonly connects variable resistor R2 and variable resistor R3 is connected with a non-inverting input terminal (+) of the operational amplifier OP. In the drawings, U+ denotes a reference voltage which is applied to the non-inverting (+) input terminal of the operational amplifier OP. A terminal which commonly connects variable resistor R1 and variable resistor R2 is connected with the output terminal of the operational amplifier OP.

The operation of the related art comparator circuit will now be described. As shown in FIG. 1, the operational amplifier OP compares the externally applied input voltage $V_{IN}$ with the reference voltage U+ and outputs an output voltage $V_{OUT}$. If the input voltage $V_{IN}$ is greater than the reference voltage U+, the output voltage $V_{OUT}$ becomes the ground voltage $-V_{EE}$. If, however, the input voltage $V_{IN}$ is less than the reference voltage U+, the output voltage $V_{OUT}$ becomes the power supply voltage $V_{CC}$. Thus, $V_{IN} > U+$, $V_{OUT} = -V_{EE}$ $V_{IN} < U+$, $V_{OUT} = V_{CC}$ However, the reference voltage U+ of the conventional comparator is variable in accordance with variable resistors R1 through R3 forming a voltage divider circuit. Thus, $$U += \frac{R3}{R1 + R2 + R3} \times V_{CC} \quad (1)$$

As described above, the related art comparator has various disadvantages. In accordance with Equation 1, since the related art reference voltage U+ varies in accordance with the variable resistors R1 through R3, the reference voltage U+ becomes unstable, making it difficult to properly operate the comparator.

The above references or above related art are incorporated by reference herein where appropriate for appropriate teachings of additional or alternative details, features and/or technical background.

SUMMARY OF THE INVENTION

An object of the present invention is to provide a reference voltage generation circuit that substantially overcomes at least one of the aforementioned problems encountered in the related art.

Another object of the present invention is to provide an improved reference voltage generation circuit which is capable of generating a reference voltage having multiple steps by using a periodic response characteristic of a chaotic circuit.

To achieve at least the above objections in whole or in part, there is provided a reference voltage generation circuit which includes a first sample/hold unit for sampling and holding a periodic output voltage in accordance with a first clock signal from an externally connected clock signal generation unit, a second sample/hold unit for sampling and holding the output voltage from the first sample/hold unit in accordance with a second clock signal from the externally connected clock signal generation unit, a non-linear unit for outputting a non-linear voltage having a sawtooth-shaped transfer characteristic line by using an output voltage from the second sample/hold unit, and an addition unit for adding the non-linear voltage from the non-linear unit and an externally applied voltage and outputting the periodic output voltage to the outside and to the first sample/hold unit.

Additionally, to achieve at least the above objects in a whole or in parts, there is provided a reference voltage generating circuit, including a signal generating unit responsive to a first input voltage to generate a non-linear signal, where the signal generating unit combines the non-linear signal with an externally applied voltage to provide a reference voltage, and a sample and hold circuit coupled to the signal generating unit for receiving the reference voltage, where the sample and hold circuit is responsive to two different clock signals, which do not overlap with each other, and provide the first input voltage to the signal generating unit.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1:
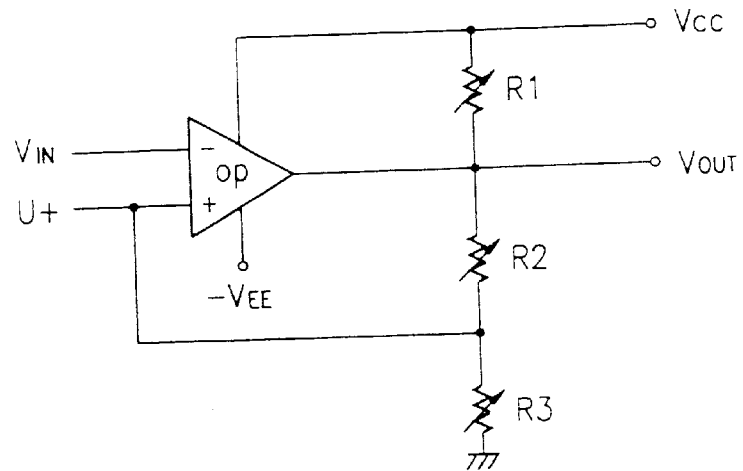
FIG. 1 is a circuit diagram illustrating a related art comparator.
Figure 2:
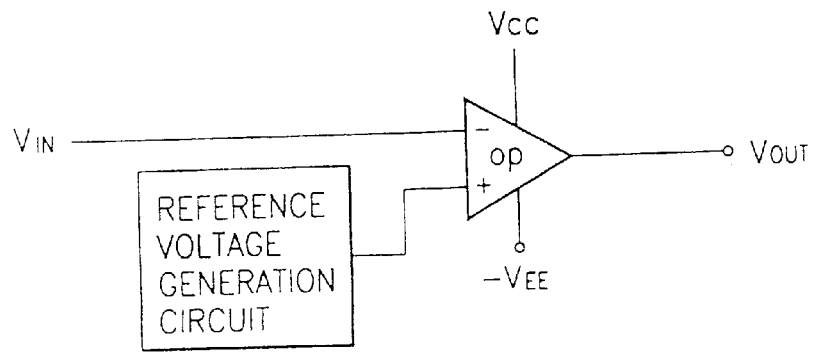
FIG. 2 is a circuit diagram illustrating a comparator having a reference voltage generation circuit according to a preferred embodiment the present invention.

FIG. 2 illustrates one embodiment of a comparator implementing the reference voltage generation circuit according to the present invention. As shown therein, a reference voltage generation circuit, formed of a chaotic circuit, is connected to a non-inverting terminal (+) of a 74-series operational amplifier OP.

Figure 3:
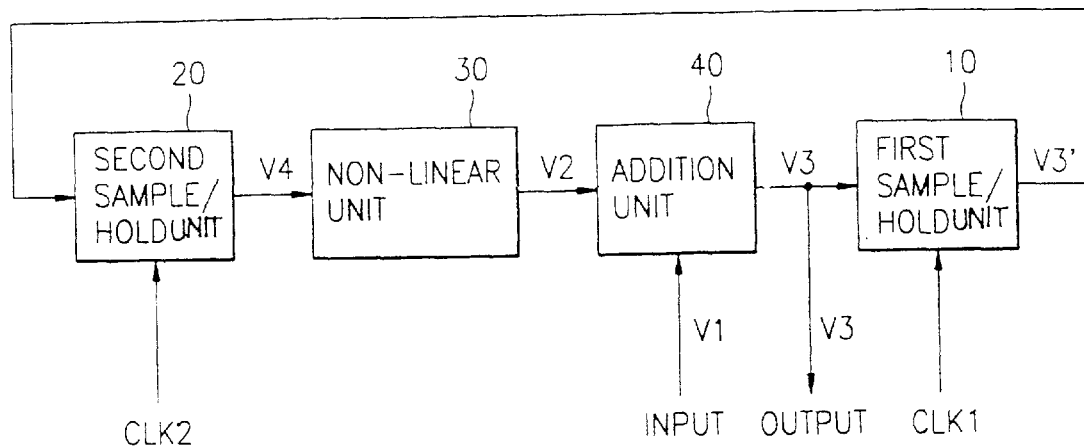
FIG. 3 is a block diagram illustrating a preferred embodiment of the reference voltage generation circuit in the circuit of FIG. 2.
Figure 4A:
FIGS. 4A and 4B are waveform diagrams of first and second clock signals in the circuit of FIG. 3.
Figure 4B:

FIG. 3 illustrates a preferred embodiment of the reference voltage generation circuit in the comparator of FIG. 2, and FIGS. 4A and 4B are timing waveforms of first and second clock signals in the circuit of FIG. 3.

As shown therein, the reference voltage generation circuit, namely, the chaotic circuit, preferably includes a first sample/hold unit 10 for sampling and holding a periodic output voltage V3 in accordance with a first clock signal CLK1. The voltage V3 is also outputted as the reference voltage to be applied to the non-inverting input terminal (+) of the operational amplifier OP. A clock signal CLK1 is provided by an externally connected clock generation unit (not shown). A second sample/hold unit 20 is coupled for sampling and holding an output voltage V3' from the first sample/hold unit 10 in accordance with a second clock signal CLK2 from an externally connected clock generation unit (not shown). A non-linear unit 30 having a sawtooth-shaped transfer characteristic receives the output V4 of the second sample and hold unit 20, and outputs a non-linear voltage signal V2. An addition unit 40 receives the non-linear voltage signal V2 from the non-linear unit 30 and adds it to voltage signal V1, and outputs the periodic output voltage V3, which is the reference voltage and the input voltage to the first sample/hold unit 10.

The clock signal generation unit is preferably formed of a crystal oscillator and a clock signal divider. The first and second clock signals CLK1 and CLK2 from the clock signal generation unit, as shown in FIGS. 4A and 4B, do not overlap with each other.

Figure 5:
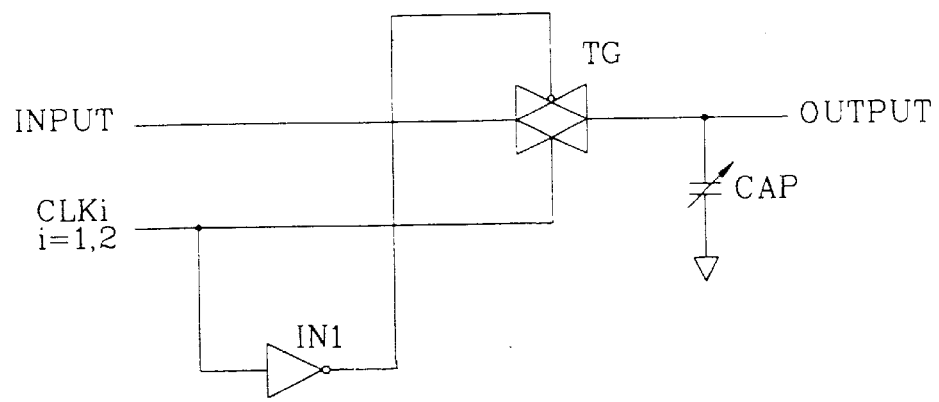
FIG. 5 is a circuit diagram illustrating a preferred embodiment of the first and second sample and hold units in the circuit of FIG. 3.

As shown in FIG. 5, each of the first and second sample/hold units 10 and 20 preferably includes an inverter IN1 for inverting the respectively applied clock signal CLKi from the clock signal generation unit, and a transmission gate TG for transmitting an input signal to the next succeeding circuit when the clock signal CLKi applied to a non-inverting control terminal thereof is at a high level. The output from the inverter IN1 is coupled to the inverting control terminal of the transmission gate TG. Additionally, a variable capacitor CAP is coupled for receiving the output of the transmission gate.

Figure 6:
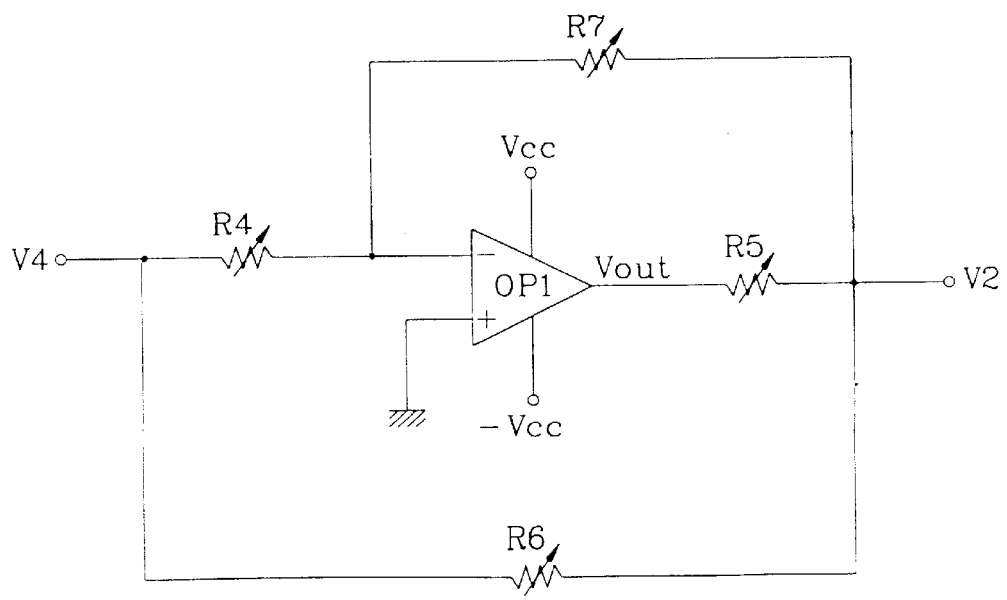
FIG. 6 is a circuit diagram illustrating a preferred embodiment of the non-linear unit in the circuit of FIG. 3.

As shown in FIG. 6, the non-linear unit 30 preferably includes a first variable resistor R4 which receives the input voltage V4 from the sample/hold unit 20, and an operational amplifier OP1 coupled between the power supply voltage $V_{CC}$ and the negative power supply voltage $-V_{CC}$, having an inverting input terminal coupled with first variable resistor R4, and a non-inverting input terminal coupled to ground. A second variable resistor R5 is connected in series with the output terminal of the operational amplifier OP1 for receiving an output voltage $V_{OUT}$ of OP1, and for outputting the voltage signal V2. Additionally, a third variable resistor R6 is connected such that the output voltage signal V2 from second variable resistor R5 is fed back to the input terminal of first variable resistor R4, and a fourth variable resistor R7 is commonly connected such that the output voltage V2 from second variable resistor R5 is fed back to the inverting input terminal of the operational amplifier OP1. Resistors R5, R6 and R7 are commonly connected at node P.

Figure 7:
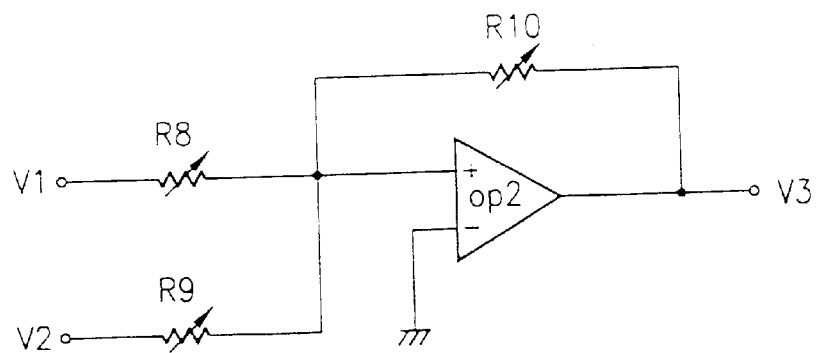
FIG. 7 is a circuit diagram illustrating a preferred embodiment of the addition unit in the circuit of FIG. 3.

As shown in FIG. 7, the addition unit 40 preferably includes an operational amplifier OP2, having a non-inverting input terminal coupled with the first and second variable resistors R8 and R9 which receive the first and second input voltage signals V1 and V2, respectively, and an inverting input terminal coupled to the ground voltage. The operational amplifier OP2 outputs a voltage signal V3, which is fed back to the non-inverting input terminal through a third variable resistor R10.

The chaotic circuit is formed of the first and second sample/hold units 10 and 20, the non-linear unit 30, and the addition unit 40. The response from the chaotic circuit is classified into a periodic response and a chaotic response. According to one embodiment of the present invention, a reference voltage having multiple steps is generated by using the above-described periodic response characteristic of the chaotic circuit and is adapted to a comparator and a Schmitt trigger.

The operations of the reference voltage generation circuit according to the first embodiment will now be described with reference to the Figures. The first clock signal CLK1 from the externally connected clock generation unit is applied to the first sample hold unit 10. For example, the first clock signal CLK1 is applied to the non-inverting control terminal of the transmission gate TG and to the inverter IN1, which is coupled to the inverting control terminal of the transmission gate TG. The transmission gate TG is activated when the first clock signal CLK1 goes high. At this time, the transmission gate TG receives the voltage signal V3 from the addition unit 40, and outputs the output voltage signal V3'. Also, the capacitor CAP charges with the output voltage V3'. When the first clock signal CLK1 goes low, the transmission gate TG becomes disabled, and the charged capacitor CAP holds the output voltage V3' from the transmission gate TG. The first sample/hold unit 10 thus maintains the level of the output voltage signal V3' by the operation of the variable capacitor CAP.

The second sample/hold unit 20 samples and holds the output voltage V3' from the first sample/hold unit 10 in accordance with the second clock signal CLK2 as shown in FIG. 4B, in a manner similar to that described with respect to the operation of the first sample/hold unit 10. Second sample/hold unit 20 outputs voltage signal V4 to the non-linear unit 30.

Figure 8:
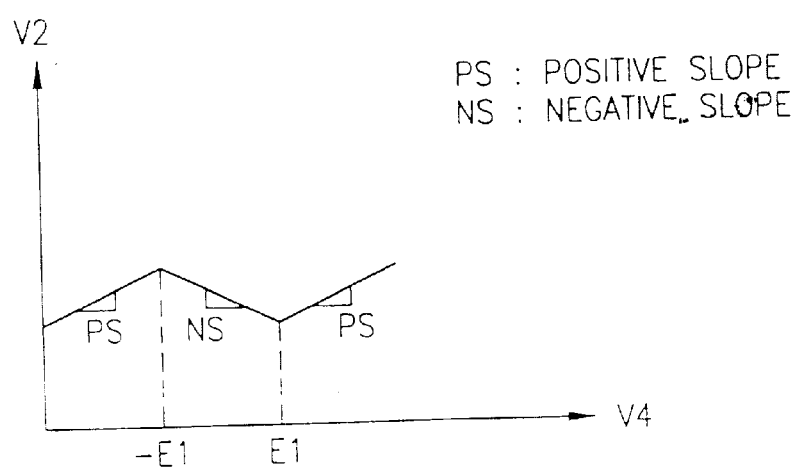
FIG. 8 is a waveform diagram of an input/output signal from a preferred embodiment of the non-linear unit according to the present invention.

The non-linear unit 30 receives voltage signal V4 and outputs voltage signal V2. As shown in FIG. 8, the non-linear unit 30 has a sawtooth-shaped transfer characteristic with three linear regions, where E1 and −E1 denote transition points of the curved line. The non-linear unit 30 outputs voltage signal V4, which is an unstable periodic output. One embodiment of the present invention is directed to using a part of the unstable periodic characteristic as a reference voltage for a comparator.

Referring to FIG. 8, the saw-toothed transfer characteristic is described as follows. The non-linear circuit 30 of FIG. 6 includes a linear term as well as a non-linear term. That is, variable resistor R6 indicates the linear term, which stably converges, and variable resistors R4 and R7 indicate a non-linear term, which unstably diverges. Accordingly, the circuit is a homoclinic circuit in which poles simultaneously exist in the left and right hemispheres. In addition, the curves of FIG. 8 can be mathematically expressed by way of the following equations, using a piecewise linear method which changes a non-linear value to a linear value. Thus, $$f(y(t)) = PS \times y(t) + \frac{NS - PS}{2 \times PS \times E1}[|y(t) + E1| - |y(t) - E1|] \quad (2)$$

where:

$$f(y(t)) = PS \times y(t) + \frac{NS - PS}{E1 \times PS} \times y(t) \quad -E1 < y(t) < E1 \quad (3)$$

$$f(y(t)) = PS \times y(t) + \frac{NS - PS}{PS} \quad y(t) > E1 \quad (4)$$

$$f(y(t)) = PS \times y(t) - \frac{NS - PS}{PS} \quad y(t) < -E1 \quad (5)$$

Equations (2) through (5) are expressed by using a piecewise linear method, in which y(t) is indicated along the horizontal axis of FIG. 8, that is the input voltage $V_4$ of the circuit shown in FIG. 6 and f(y(t)) is indicated along the vertical axis therein, being the output voltage $V_2$ of the circuit in FIG. 6. Thus, the function illustrated in FIG. 8 can be expressed in Equation (2) as follows.

$$f(y(t)) = PS \times y(t) + \frac{NS - PS}{2 \times PS \times E1}[|y(t) + E1| - |y(t) - E1|] \quad (2)$$

I) In Equation (2), when –E1<y(t)<E1, $$f(y(t)) = PS \times y(t) + \frac{NS - PS}{2 \times PS \times E1}[(y(t) + E1) - (-y(t) + E1)] \quad (3)$$

$$= PS \times y(t) + \frac{NS - PS}{2 \times PS \times E1} \times 2 \times y(t)$$

$$\therefore f(y(t)) = PS \times y(t) + \frac{NS - PS}{PS \times E1} \times y(t)$$

ii) In Equation (2), when y(t)>E1, $$f(y(t)) = PS \times y(t) + \frac{NS - PS}{2 \times PS \times E1}[(y(t) + E1) - (y(t) - E1)] \quad (4)$$

$$= PS \times y(t) + \frac{NS - PS}{2 \times PS \times E1} \times 2 \times E1$$

$$\therefore f(y(t)) = PS \times y(t) + \frac{NS - PS}{PS}$$

iii) In Equation (2), when y(t)<–E1, $$f(y(t)) = PS \times y(t) + \frac{NS - PS}{2 \times PS \times E1}[(-y(t) - E1) - (-y(t) + E1)] \quad (5)$$

$$= PS \times y(t) + \frac{NS - PS}{2 \times PS \times E1} \times (-2) \times E1$$

$$\therefore f(y(t)) = PS \times y(t) - \frac{NS - PS}{PS}$$

As used herein, NS is a negative slope and PS is a positive slope, as defined below.

Further, by applying Kirchoff's current law (KCL) to node P of FIG. 6, the following equations can be derived:

$$-\frac{V4}{R4} = \frac{V2 - Vout}{R5} + \frac{V2 - V4}{R6} \quad (6)$$

$$V2 = \frac{R5(R4 - R6)}{R4(R5 + R6)} \times V4 + \frac{R6}{R5 + R6} \times Vout \quad (7)$$

As used in the preceding equations, PS, NS, and E1, which are shown in FIG. 8, can be expressed as follows:

$$PS = \frac{R5(R4 - R6)}{R4(R5 + R6)} \quad (8)$$

$$NS = PS - \frac{R6 \times E1}{R5 + R6} \times PS \quad (9)$$

$$= \frac{R5(R4 - R6)}{R4(R5 + R6)} - \frac{E1 \times R6 \times R5(R4 - R6)}{R4 \times (R5 + R6)^2}$$

$$E1 = \pm \frac{R4}{R7} \times V2 \quad (10)$$

Additionally,
if V4<–E1, $V_{OUT}=V_{CC}-2$;
if –E1<V4<E1, $V_{OUT}=-V4$; and
if V4>E1, $V_{OUT}=-(V_{CC}-2)$.

The voltage signal V2 denotes the output voltage signal from the non-linear unit 30, the voltage signal V4 denotes the output voltage signal from the second sample/hold unit 20, and the voltage signal Vout denotes the output from the operational amplifier OP1.

The addition unit 40 preferably adds the output voltage signal V2 from the non-linear unit 30 and voltage signal V1 by using operational amplifier OP2 as a summing amplifier, and the thusly added output voltage signal V3 is the reference voltage. The output voltage signal V3 is also outputted to the first sample/hold unit 10. The output voltage signal V3 may be expressed as follows:

$$V3 = R10 \times \left(\frac{V1}{R8} + \frac{V2}{R9}\right) \quad (11)$$

If the resistors R8 and R9 have identical values, the output signal V3 may be expressed as follows:

$$V3 = \frac{R10}{R8} \times (V1 + V2) \quad (12)$$

The chaotic circuit performs the above-described process and outputs the output the voltage signal V3 in accordance with the first and second clock signals CLK1 and CLK2. Thus, the clock signals CLK1 and CLK2 control the periodic response characteristic, and it is possible to form a reference voltage V3 having multiple steps. In one embodiment, the reference voltage which is generated during one period interval may be used for a comparator, and the reference voltage which is generated during a two-period interval may be used for a Schmitt trigger.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A reference voltage generation circuit for a comparator having an operational amplifier connected between a power supply voltage and a ground voltage, an inverting terminal of the operational amplifier receives an input voltage and a non-inverting terminal of which receives a reference voltage, comprising:

a first sample/hold unit for sampling and holding a periodic output voltage in accordance with a first clock signal;

a second sample/hold unit for sampling and holding an output voltage from said first sample/hold unit in accordance with a second clock signal;

a non-linear unit for outputting a non-linear voltage having a sawtooth-shaped transfer characteristic in accordance with an output voltage from said second sample/hold unit; and an addition unit for adding the non-linear voltage signal from said non-linear unit and an externally applied voltage and outputting the periodic output voltage to said first sample/hold unit and as the reference voltage to the operational amplifier of the comparator.

2. The circuit of claim 1, wherein each of said first and second sample/hold units comprises:

an inverter for inverting one of the clock signals;

a transmission gate for transmitting the output voltage to an output terminal when the clock signal is a high level, an inverting control terminal of said transmission gate receives an output signal from said inverter, and a non-inverting control terminal of which receives the clock signal; and a capacitor coupled to the output terminal for receiving an output signal from said transmission gate.

3. The circuit of claim 1, wherein said non-linear unit comprises:

a first variable resistor for receiving an input signal;

an operational amplifier connected between a power supply voltage and a negative power supply voltage, an inverting input terminal of said operational amplifier is connected in series with said first variable resistor, a non-inverting input terminal of said operational amplifier is connected with ground, and an output terminal of which is connected in series with a second variable resistor;

a third variable resistor connected such that an output signal from the second variable resistor is fed back to said first variable resistor; and a fourth variable resistor connected such that the output signal from the second variable resistor is fed back to the inverting input terminal of said operational amplifier.

4. The circuit of claim 1, wherein said addition unit comprises:

a first resistor having first and second electrodes;

a second resistor having first and second electrodes;

a third resistor having first and second electrodes; and an operational amplifier having first and second input electrodes and an output electrode; wherein the first electrode of said first resistor receives the externally applied voltage and the first electrode of said second resistor receives the non-linear voltage, the second electrodes of said first, second and third resistors are coupled to the first input electrode of said operational amplifier and the second input electrode is coupled to a prescribed potential, and the first electrode of said third resistor is coupled to the output electrode of said operational amplifier.

5. A reference voltage generating circuit, comprising:

a signal generating unit responsive to an input voltage to generate a non-linear signal, said signal generating unit combining the non-linear signal with an externally applied voltage to provide a reference voltage; and a sample and hold circuit coupled to said signal generating unit for receiving the reference voltage, said sample and hold circuit responsive to two different clock signals, which do not overlap with each other, for providing the input voltage to said signal generating unit.

6. The circuit of claim 5, wherein said signal generating unit comprises:

a non-linear unit with a sawtooth transfer characteristic for receiving the input voltage and generating the non-linear signal; and an addition unit for combining the non-linear signal with the externally applied voltage signal to provide the reference voltage.

7. The circuit of claim 6, wherein said non-linear unit comprises:

a first resistor having first and second electrodes;

a second resistor having first and second electrodes;

a third resistor having first and second electrodes;

a fourth resistor having first and second electrodes; and a first operational amplifier having first and second input electrodes and an output electrode, wherein the first electrode of said first and third resistors are coupled to receive the input voltage, the second electrode of said first resistor and the first electrode of said fourth resistor are coupled to the first input electrode of said first operational amplifier and the second input electrode is coupled to a first prescribed potential, and the first electrode of said second resistor is coupled to the output electrode of said first operational amplifier, and the second electrode of said third and fourth resistors are coupled to the second electrode of said second resistor.

8. The circuit of claim 7, wherein said addition unit comprises:

a fifth resistor having first and second electrodes;

a sixth resistor having first and second electrodes;

a seventh resistor having first and second electrodes; and a second operational amplifier having first and second input electrodes and an output electrode, wherein the first electrode of said fifth resistor receives the externally applied voltage and the first electrode of said sixth resistor receives the non-linear signal, the second electrodes of said fifth, sixth, and seventh resistors are coupled to the first input electrode of said second operational amplifier and the second input electrode is coupled to a second prescribed potential, and the first electrode of said seventh resistor is coupled to the output electrode of said second operational amplifier.

9. The circuit of claim 8, wherein said sample and hold circuit comprises:

a first sample and hold circuit coupled to the output of said addition unit for receiving the reference voltage and coupled for receiving a first clock signal; and a second sample and hold unit coupled for receiving an output from said first sample and hold circuit, coupled for receiving a second clock signal, and coupled to said non-linear unit, wherein said first and second clock signals do not overlap, and wherein the output of said second sample and hold provides the input voltage to said non-linear unit.

10. The circuit of claim 9, wherein said first sample and hold circuit comprises:
   a first inverter having an input electrode and an output electrode;
   a first capacitor having an input electrode and an output electrode; and
   a first transmission gate having an input electrode, an output electrode, and first and second control electrodes, wherein the input electrode of said first inverter and the first control electrode of said first transmission gate are coupled for receiving the first clock signal, the output electrode of said first inverter is coupled to the second control electrode of said first transmission gate, the input electrode of said first transmission gate is coupled to the output of said addition unit for receiving the reference voltage, and the input electrode of said first capacitor is coupled to the output electrode of said first transmission gate.

11. The circuit of claim 10, wherein said second sample and hold circuit comprises:
   a second inverter having an input electrode and an output electrode;
   a second capacitor having an input electrode and an output electrode; and
   a second transmission gate having an input electrode, an output electrode, and first and second control electrodes, wherein the input electrode of said second inverter and the first control electrode of said second transmission gate are coupled for receiving the second clock signal, the output electrode of said second inverter is coupled to the second control electrode of said second transmission gate, the input electrode of said second transmission gate is coupled for receiving an output voltage from said first sample and hold unit, and the input electrode of said second capacitor is coupled to the output electrode of said second transmission gate.

12. The circuit of claim 7, wherein the first input electrode is coupled to an inverting input of said first operational amplifier, and said second input electrode is coupled to a non-inverting input of said first operational amplifier.

13. The circuit of claim 8, wherein the first input electrode is coupled to a non-inverting input of said second operational amplifier, and said second input electrode is coupled to an inverting input of said second operational amplifier.

14. The circuit of claim 5, wherein said sample and hold circuit comprises:
   a first sample and hold circuit coupled to the output of said signal generating unit for receiving the reference voltage, and coupled for receiving a first clock signal; and
   a second sample and hold unit coupled for receiving an output from said first sample and hold circuit, and coupled for receiving a second clock signal, wherein said first and second clock signals do not overlap.

15. The circuit of claim 14, wherein said first sample and hold circuit comprises:
   a first inverter having an input electrode and an output electrode;
   a first capacitor having an input electrode and an output electrode; and
   a first transmission gate having an input electrode, an output electrode, and first and second control electrodes, wherein the input electrode of said first inverter and the first control electrode of said first transmission gate are coupled for receiving the first clock signal, the output electrode of said first inverter is coupled to the second control electrode of said first transmission gate, the input electrode of said first transmission gate is coupled to the output of said signal generating unit for receiving the reference voltage, and the input electrode of said first capacitor is coupled to the output electrode of said first transmission gate.

16. The circuit of claim 15, wherein said second sample and hold circuit comprises:
   a second inverter having an input electrode and an output electrode;
   a second capacitor having an input electrode and an output electrode; and
   a second transmission gate having an input electrode, an output electrode, and first and second control electrodes, wherein the input electrode of said second inverter and the first control electrode of said second transmission gate are coupled for receiving the second clock signal, the output electrode of said second inverter is coupled to the second control electrode of said second transmission gate, the input electrode of said second transmission gate is coupled for receiving an output voltage from said first sample and hold unit, and the input electrode of said second capacitor is coupled to the output electrode of said second transmission gate.

17. The circuit of claim 16, wherein said signal generating unit comprises:
   a non-linear unit with a sawtooth transfer characteristic for receiving the input voltage and generating the non-linear signal and
   an addition unit for combining the non-linear signal with the externally applied voltage signal to provide the reference voltage.

18. The circuit of claim 14, wherein said signal generating unit comprises:
   a non-linear unit with a sawtooth transfer characteristic for receiving the input voltage and generating the non-linear signal; and
   an addition unit for combining the non-linear signal with the externally applied voltage signal to provide the reference voltage.

* * * * *